United States Patent [19]

Redfern et al.

[11] 4,191,900

[45] Mar. 4, 1980

[54] PRECISION PLURAL INPUT VOLTAGE AMPLIFIER AND COMPARATOR

[75] Inventors: Thomas P. Redfern; Joseph J. Connolly; Thomas M. Frederiksen, all of San Jose, Calif.

[73] Assignee: National Semiconductor Corporation, Santa Clara, Calif.

[21] Appl. No.: 872,966

[22] Filed: Jan. 27, 1978

[51] Int. Cl.² .................... H03K 5/20; H03K 17/60
[52] U.S. Cl. ................................ 307/355; 307/240; 307/243; 307/251; 307/357
[58] Field of Search ............... 307/240, 243, 251, 355, 307/357, 364; 364/602

[56] References Cited

U.S. PATENT DOCUMENTS

| 3,676,702 | 7/1972 | McGrogan, Jr. ............... 307/251 X |
| 4,028,558 | 6/1977 | Heller et al. ...................... 307/355 |
| 4,075,509 | 2/1978 | Redfern .......................... 307/355 X |
| 4,097,753 | 6/1978 | Cook et al. ................. 307/DIG. 3 X |

Primary Examiner—Larry N. Anagnos
Attorney, Agent, or Firm—Gail W. Woodward

[57] ABSTRACT

A high-gain, capacitor-coupled, chopper-stabilized, direct-current, voltage amplifier is capacitor coupled to a plurality of input switch pairs, each of which alternately couples one of a pair of input terminals to the amplifier. Thus, a voltage comparator results which has a plurality of pairs of inverting and non-inverting inputs. The relative contribution of the inputs can be weighted by ratioing the coupling capacitors of the switch pairs.

9 Claims, 8 Drawing Figures

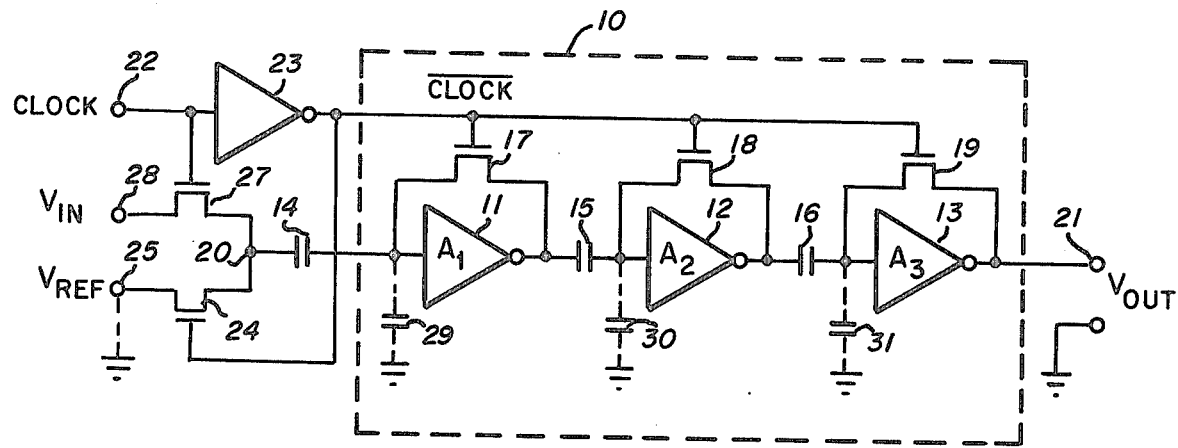
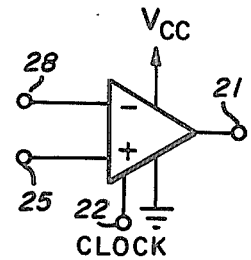
Fig_1 PRIOR ART
Fig_1a PRIOR ART
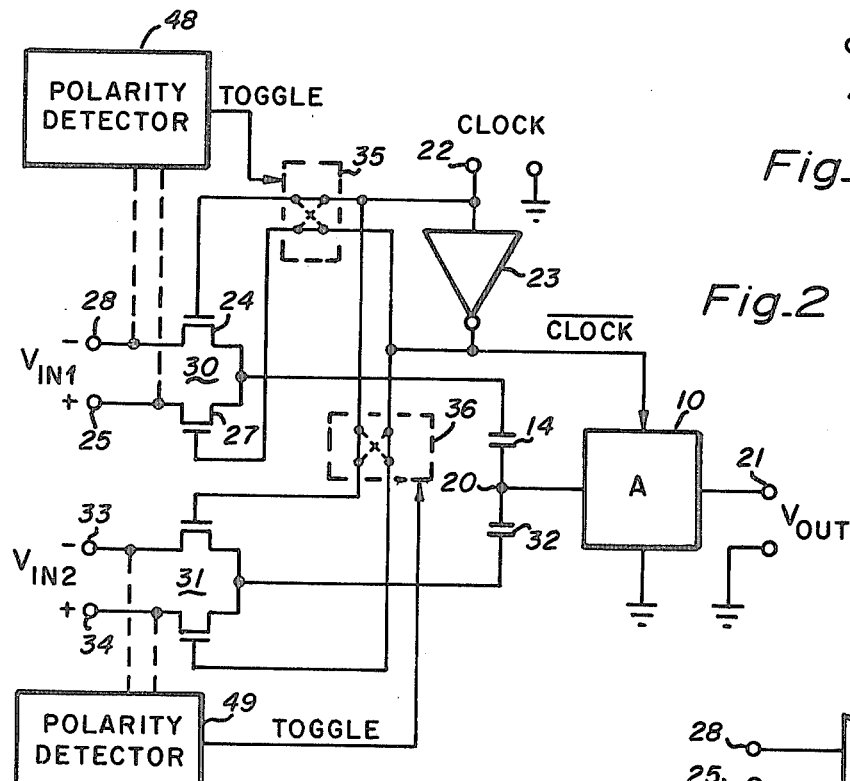
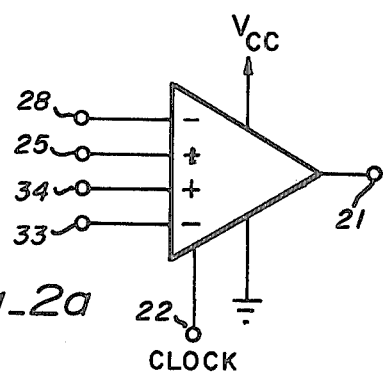
Fig_2
Fig_2a

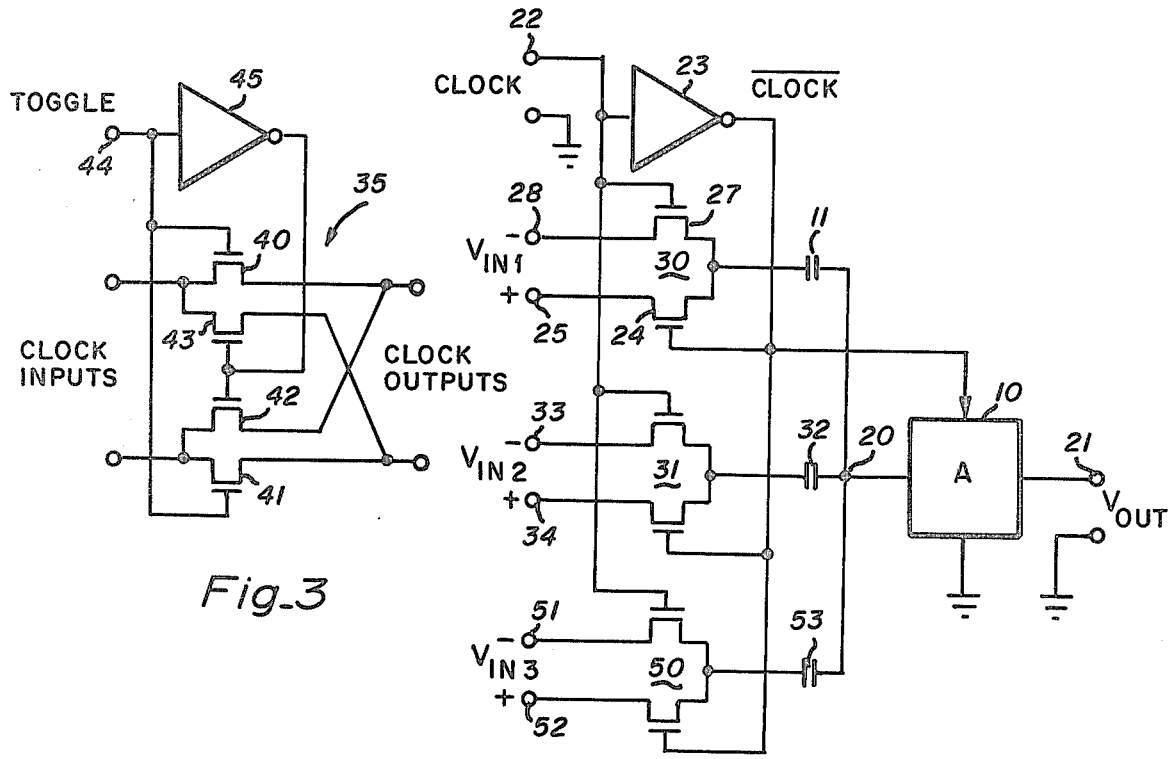
Fig_3
Fig_4
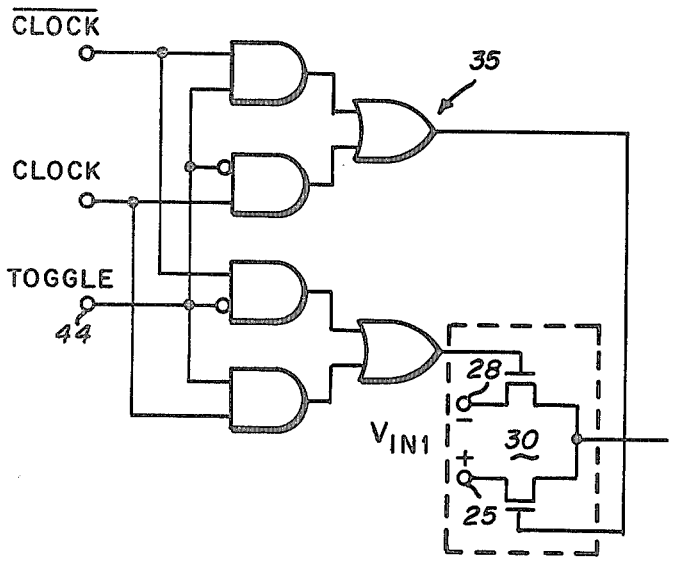
Fig_3a
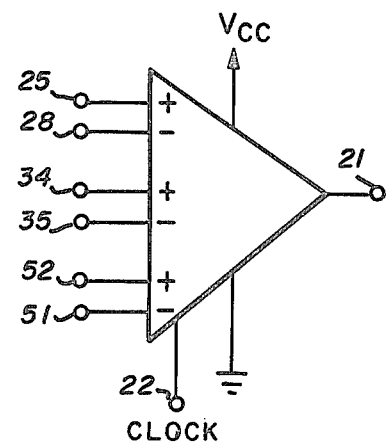
Fig_4a

PRECISION PLURAL INPUT VOLTAGE AMPLIFIER AND COMPARATOR

BACKGROUND OF THE INVENTION

Comparators are well known in prior art and have been developed to a high degree. Typically, such devices compare one analog voltage to another and provide a digital output that indicates which input voltage is higher than the other. Ordinarily, the comparator is simply a high gain direct coupled amplifier with a differential input stage. Linear integrated circuit technology is typically used to fabricate high quality precision comparators. Generally, such devices must be trimmed during (or after) fabrication to achieve a suitably low offset voltage.

Using metal oxide semiconductor (MOS) technology it has proven very difficult to fabricate high gain linear amplifiers suitable for comparators. Accordingly, in D/A and A/D applications hybrid technology has been employed for high performance precision devices. More recently it has been found that suitable precision could be attained in MOS comparators if chopper stabilized capacitor coupled amplifier stages are employed. Thus, the comparator function could be integrated into a single chip using large scale integration (LSI) of MOS devices. Once the problem of switching transient suppression and metallization error compensation was solved, MOS comparators became practical. For example see the copending application of Thomas P. Redfern, Ser. No. 731,269, filed Oct. 12, 1976, now U.S. Pat. No. 4,075,509, and titled CMOS COMPARATOR CIRCUIT AND METHOD OF MANUFACTURE.

SUMMARY OF THE INVENTION

It is an object of the invention to provide a high gain precision comparator having at least two inverting and two non-inverting inputs.

It is a further object of the invention to provide a comparator having a plurality of pairs of inputs in which the sense of the input pairs can easily be switched electronically without interrupting the signal paths.

It is a still further object of the invention to provide a comparator having a plurality of pairs of inputs in which selected pairs can be provided with precisely weighted responses.

These and other objects are achieved in MOS form in the following manner. A gain block is provided by cascading a plurality of capacitor coupled inverter stages. Each inverter has a clocked switch that drives the stage to its trip point when on. When the clocked switches are off, the cascade has a high gain response to the input potential with the output going high or low as a function of the input relative to the input during the switch on interval. A pair of input switches clocked in complementary fashion alternately connect a pair of input terminals to the gain block via a coupling capacitor. In effect, the output will be a function of the two inputs and responsive to the input differential. The input polarity can easily be reversed by changing the clock sense to the input switch pair. Additional input switch pairs can be capacitively coupled to the gain block input, thus providing a plurality of input pairs. If the coupling capacitors are made equal, a relatively easy achievement in MOS technology, the inputs have the same weight. Input weighting is achieved by ratioing the coupling capacitors in accordance with the weighting factor desired.

BRIEF DESCRIPTION OF THE DRAWING

FIG. 1 is a diagram of a prior art MOS clocked comparator;

FIG. 1a is a symbol for the comparator of FIG. 1;

FIG. 2 is a diagram of the comparator of the invention;

FIG. 2a is a proposed symbol for the comparator of FIG. 2;

FIG. 3 is a diagram of a DPDT clock signal reversing switch using MOS devices and electronic toggling;

FIG. 3a is an alternative clock signal reversing circuit using digital logic;

FIG. 4 is a diagram of a comparator with three input pairs; and

FIG. 4a is a proposed symbol for the comparator of FIG. 4.

DESCRIPTION OF THE INVENTION

FIG. 1 represents a typical high performance comparator commonly used in PMOS or NMOS circuits. With CMOS, these switches (and those of FIGS. 2, 3, and 4) can be replaced by transmission gates. The heart of the device is gain block 10. Three inverters 11–13 are shown, each one having substantial gain and cascaded to obtain a very high overall gain. For example, typical MOS inverters can have a gain in the range of 10–50. If each one has a gain of 50, the overall gain in block 10 would be 125,000. If the circuit were to be operated at a 5 volt logic level, the linear input range would be 40 microvolts. While not shown, each of the inverter stages will be supplied with an operating potential source usually labeled $V_{CC}$.

The individual inverters are capacitively coupled by capacitors 14–16 and the amplifier is chopper stabilized to give it a d-c gain characteristic. Switches 17–19 periodically couple the output of each inverter back to its input, and the switches are driven in parallel from a clock source 22 (not shown) and through inverter 23. For the sake of the following discussion, it will be assumed that the MOS switches are on when their gates are high or at logic one, and off when low or at logic zero. Thus, when $\overline{CLOCK}$ is high, switches 17–19 will all be on. For this condition, each inverter will be forced to a bias point where the input voltage equals the output voltage. This is normally called the trip point and is, typically, close to one half of the inverter supply voltage. At the same time, switch 24 will be on and circuit node 20 will be returned to $V_{REF}$ at terminal 25 which can be at, for example, ground as shown by the dashed line. Capacitor 14 will quickly charge to the potential of the input trip point of inverter 11. Capacitor 15 will quickly charge to the difference in trip points between inverters 11 and 12. Capacitor 16 will quickly charge to the difference between trip points between inverters 12 and 13. Output terminal 21 will be at the trip point of inverter 13. The duration of $\overline{CLOCK}$ is made long enough to ensure capacitors 14–16 have time to become fully charged. At this time, node 20 is a $V_{REF}$ or ground potential.

When the CLOCK at 22 goes high, $\overline{CLOCK}$ goes low and turns off switches 17–19 and 24. Switch 27 is turned on and couples input terminal 28 to node 20 which will then follow the potential at terminal 28. If $V_{IN}$ is at ground potential, output terminal 21 will remain at the previously established trip point. If $V_{IN}$ is above round by more than about 20 microvolts, terminal 21 will fall to logic zero. If $V_{IN}$ is below ground (negative) by more than about 20 microvolts, terminal 21 will go to logic one.

Within the linear 40 microvolt amplifier range its gain will be:

$$A = -V_{IN}(A_{11} \cdot A_{12} \cdot A_{13} \cdot K) \quad (1)$$

Where:
A is the gain of the amplifier 10
$A_{11}$–$A_{13}$ is the individual inverter stage gain
K is a constant less than 1 representing the capacitive division ratio that will be explained hereinafter.

As can be seen, each inverter 11–13 has an input coupling capacitor 14–16 and a stray or shunt parasitic capacitance 29–31 to ground. Thus, each inverter has a built-in capacitive signal attenuator. However, if the coupling capacitance value is made large with respect to the stray, little attenuation is encountered. A typical design can yield an attenuation of about 0.8 for each coupling capacitor which would reduce the above mentioned gain of 120,000 to 61,400. This would yield an input sensitivity of approximately 80 (or ±40) microvolts instead of the 40 that would obtain without stray capacitance.

The circuit, therefore, represents a very high gain amplifier operating down to d-c. An offset voltage of zero results from the use of perfect switches and the offset will not drift with temperature or time.

While gain block 10 shows three inverters 11–13, and for this reason the A of equation (1) is negative, any number of inverters could be used. For an even number, A would be positive. In practice, the number will depend upon the gain of each inverter and the sensitivity required.

FIG. 1a shows the symbol used for the device of FIG. 1. The symbol shows a simple clocked comparator.

FIG. 2 shows a comparator with a plurality of pairs of inputs in accordance with the invention. Switches 24 and 27 make up a switch pair 30 coupled by capacitor 14 to amplifier 10. A second switch pair 31 is coupled by capacitor 32 to amplifier 10. The comparator of FIG. 2 has four inputs, 25, 28, 33, and 34. For comparator operation to output terminal 21, inputs 28 and 33 are inverting while inputs 25 and 34 are non-inverting. FIG. 2a shows a proposed symbol.

In the circuit of FIG. 2, node 20 will see two inputs, one via capacitor 14 and one via capacitor 32. Thus, the comparator output will be related to the input terminal potentials as follows:

$$V_{OUT} = (V_{34} + V_{25}) - (V_{33} + V_{28}) \quad (2)$$

This expression assumes that $C_{14} = C_{32}$.

In many applications, it is desirable to weight a circuit response to a signal. In particular, in analog-to-digital (A/D) converters weighting is useful to expand two or more low resolution digital-to-analog converters (DACS) into a single A/D which has an overall resolution (in bits) that is the sum of the bits of the DACS used.

For example, the comparator of FIG. 2 could be employed by coupling a positive analog voltage to terminal 25 or a negative analog voltage to terminal 28. Two 4-bit DACS (the second of which has a full scale equal to the least significant tap of the first DAC) converters can be coupled to terminals 33 and 34 respectively. The result is the heart of a successive approximation A/D converter of 8-bit capability using less total components and therefore a smaller area on an IC chip. The circuit action is that the second DAC is used as a vernier between any adjoining pair of steps (TAPS) on the first or most significant DAC.

Input weighting can be achieved by making capacitors 14 and 32 unequal. The inputs from switches 30 and 31 will then be wieghted by the capacitor ratios. For example, if capacitor 14 has ten times the capacitance of capacitor 32, inputs 25 and 28 will be ten times as effective as inputs 33 and 34.

One of the advantages of the circuit of FIG. 2 is the ease of switching the input polarity. For example, if the timing of the CLOCK and $\overline{\text{CLOCK}}$ signals applied to switch pair 30 are reversed, the input polarity sense is reversed. Since the input terminals are undisturbed, there is no discernable change in circuit response. The same two input devices 24 and 27 still switch the inputs but sense reversal occurs. Typically, prior art comparators employed a DPDT reversing switch on the input terminals. In this kind of device, the two polarities invoke two different sets of signal path device conditions.

FIG. 3 shows a typical DPDT polarity reversing switch. This is one kind of circuit which can be employed at 35 and 36 in FIG. 2. Four switches 40–43 are employed, connected as shown, and controlled by toggle terminal 44. When toggle terminal 44 is high, switches 40 and 41 will be on. Inverter 45 will have its output low, thus turning switches 42 and 43 off. For this condition, the input clock signals are coupled straight through to the output terminals. When toggle terminal 44 is low, switches 40 and 41 will be off. The output of inverter 45 is high, thus turning switches 42 and 43 on. For this condition, the input clock terminals are transposed to the output terminals. Thus, the DPDT switch action can be used at 35 to reverse the switching of pair 30 to control the sense polarity of terminals 25 and 28. An alternate switching technique is shown in FIG. 3a. When the polarity control terminal, 44, is true (high voltage state) the polarity of switch pair 30 inside the dashed outline is as shown on the figure. When terminal 44 is low, the input polarities are reversed; i.e., terminal 28 becomes the positive input and terminal 25 becomes the negative input. This interchange of the input polarity is useful to provide an A/D converter with an autopolarity feature.

As shown in FIG. 2 a polarity detector 48 is coupled as shown by the dashed lines to switch pair 30. If the polarity is normal as shown, the clocking is undisturbed. If the opposite polarity exists, detector 48 will toggle circuit 35 to reverse the clocking lines. Thus terminal 28 would be the noninverting input and terminal 25 would be the inverting input. Polarity detector 49 would provide autopolarity control via switch 36 to control inputs 33 and 34 in a similar manner.

The circuit of FIG. 2 can, if desired, be expanded to include additional input pairs as shown in FIG. 4. An additional switch pair 50 couples inputs 51 and 52 alternately via capacitor 53 to node 20. Capacitor 53 can be ratioed with respect to capacitors 14 and 32 to weight the input response at terminals 51 and 52. Clearly, more additional pairs of inputs can be coupled to node 20 as desired.

FIG. 4a shows a symbol proposed for the circuit of FIG. 4.

The invention has been described and embodiments shown to illustrate its scope. There are alternatives and equivalents that will occur to a person skilled in the art after he studies the foregoing disclosure. For example, while switches 17-19 of FIG. 1 short the inputs to the outputs of inverters 11-13, the same action can be achieved by switching each of the inverter inputs to a reference potential which then by definition is the trip point. Still other forms of chopper stabilization and input coupling can be used. Accordingly, it is intended that the scope of the invention be limited only by the following claims.

We claim:

1. A clocked comparator having an inverting input and a non-inverting input, said inputs being transposable in response to the application of a control signal, said comparator comprising:
   an inverter having an input, an output, and substantial gain;
   clock means for periodically switching said inverter to its trip point;
   a pair of switches having common output terminals capacitively coupled to said input of said inverter, and a pair of input terminals coupled respectively to said inverting and non-inverting input terminals of said comparator, said pair of switches being operated in complementary fashion by said clock means; and
   electronic means for reversing the sense of said complementary switching in response to the application of said control signal whereby said inverting and non-inverting inputs are transposed without interrupting the signal paths of said comparator.

2. The comparator of claim 1 wherein said electronic means comprises a transistor switch having a double pole double throw signal reversing configuration and control means responsive to said control signal for switching the transistors in said transistor switch.

3. The comparator of claim 1 wherein said electronic means comprises digital gating.

4. A comparator having a plurality of inverting inputs and a plurality of non-inverting inputs, and an output responsive to a combination of said inputs, said comparator comprising:
   an inverter having an input, an output, and substantial gain;
   means for periodically switching said inverter to its trip point during a first time interval;
   first and second capacitors, each having a pair of terminals, the first one of which is coupled to said input of said inverter;
   first switching means for alternately coupling first and second input terminals to the second terminal of said first capacitor, said alternate coupling providing sequential time intervals, one of which coincides with said first time interval; and
   second switching means for alternately coupling third and fourth input terminals to the second terminal of said second capacitor, said alternate coupling providing sequential time intervals, one of which coincides with said first time interval, whereby said output of said inverter is responsive to the difference in potential between said first and second terminals in combination with the difference in potential between said third and fourth terminals.

5. The comparator of claim 4 wherein said capacitors are of equal value and wherein said combination of the input terminal potential differences gives equal weighting.

6. The comparator of claim 4 wherein said capacitors have ratioed values and wherein said combination is weighted by said ratio in responding to said input terminal potential differences.

7. The comparator of claim 4 further including a third capacitor having a pair of terminals the first one of which is coupled to said input of said inverter and third switching means for alternately coupling fifth and sixth input terminals to the second terminal of said third capacitor with said alternate coupling providing sequential time intervals one of which coincides with said first time interval.

8. The comparator of claim 7 further including means for reversing the switching sense of at least one of said first, second, and third switching means.

9. The comparator of claim 8 further including means for sensing the polarity of said input and operating said means for reversing in response to said polarity, to provide autopolarity control.

* * * * *